United States Patent
Barretto et al.

(10) Patent No.: US 6,871,394 B2
(45) Date of Patent: Mar. 29, 2005

(54) METHOD FOR ALIGNING SUBSTRATES IN A TRAY

(75) Inventors: Anthony A. Barretto, Baguio (PH); Bernardo Abuan, Baguio (PH); Emory T. Mercado, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 262 days.

(21) Appl. No.: 10/066,295

(22) Filed: Jan. 31, 2002

(65) Prior Publication Data

US 2003/0140476 A1 Jul. 31, 2003

(51) Int. Cl.[7] ................................................. H05K 3/36
(52) U.S. Cl. ........................... 29/830; 29/743; 29/834; 269/292; 269/900; 414/752.1
(58) Field of Search ..................... 29/DIG. 44, 743, 29/744, 754, 830, 834, 836, 840, 832; 269/21, 289, 292, 900, 903; 294/64.1, 65.1; 414/416.09, 416.12, 752.1, 416.13, 752.2; 451/364; 901/40; 904/40

(56) References Cited

U.S. PATENT DOCUMENTS 4,556,362 A * 12/1985 Bahnck et al. ............ 414/744.3
5,966,903 A * 10/1999 Dudderar et al. .............. 29/743
6,019,564 A * 2/2000 Kiyokawa et al. ....... 414/223.01
6,135,291 A * 10/2000 Canella ...................... 209/573

* cited by examiner

Primary Examiner—A. Dexter Tugbang
Assistant Examiner—Donghai D. Nguyen
(74) Attorney, Agent, or Firm—Wade James Brady, III; Frederick J. Telecky, Jr.

(57) ABSTRACT

A substrate 110 that is not lying flat on its substrate tray 100 can present significant process problems when a vacuum pickup attempts to pick up the substrate and fails due to the lack of a proper bond forming between the pickup and the substrate 110. The substrate 110 left behind on the substrate tray 100 could require human intervention. Intervention slows down the manufacturing process and increases costs. A method and apparatus to ensure that substrates are laying flat when presented to the vacuum pickup pad 220 is disclosed. A plate 320 with protrusions 320 is raised into a substrate tray 100 with holes. The protrusions 320 lift the substrates 110 up off the bottom of the substrate tray 100 and ensure that they are laying flat when presented to the vacuum pickup pad 220.

8 Claims, 7 Drawing Sheets

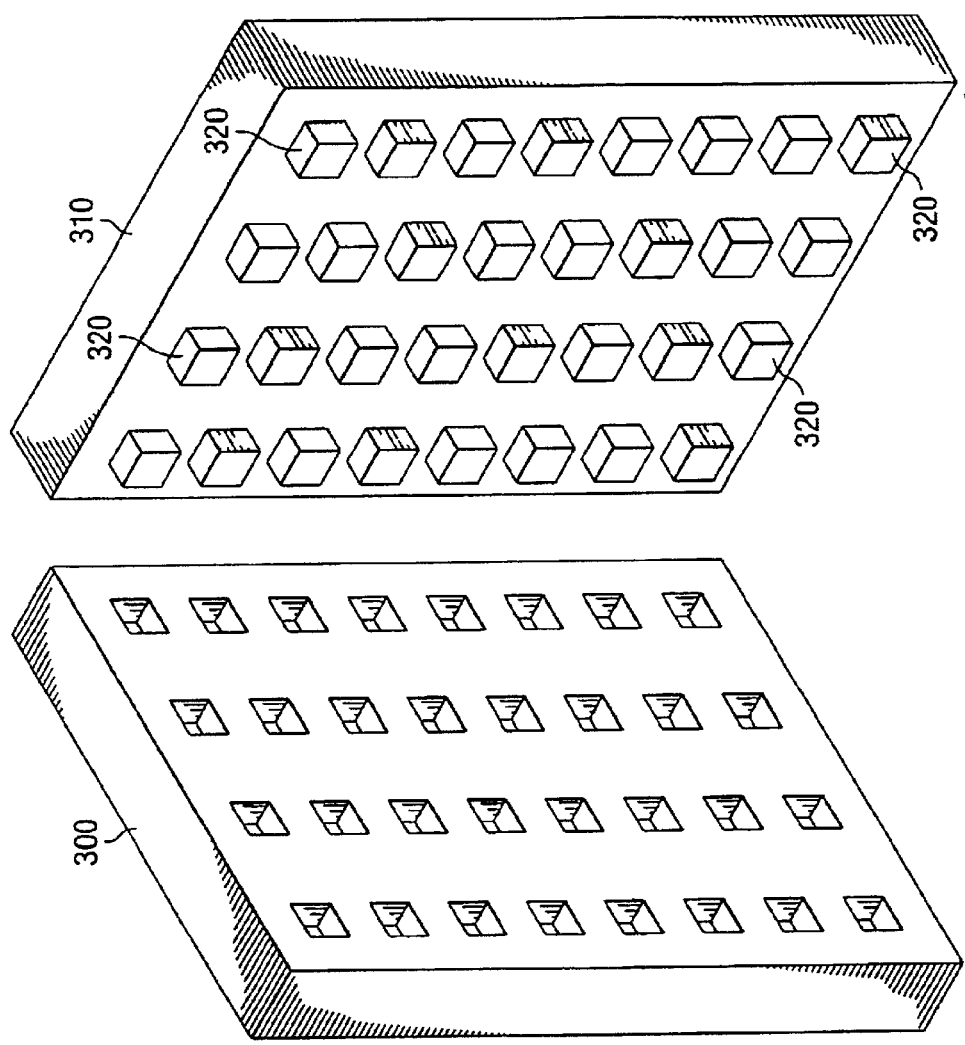

METHOD FOR ALIGNING SUBSTRATES IN A TRAY

FIELD OF THE INVENTION

This invention relates generally to semiconductor substrates, and particularly to reducing errors and mistakes during the packaging process of semiconductor substrates.

BACKGROUND OF THE INVENTION

Semiconductor devices are fabricated on wafers usually made out of silicon. The wafers are then cut into individual substrates, tested, and then packaged. There are many different ways of packaging a substrate, including Ball Grid Arrays (BGA), Flip Chip, Multi-chip Modules, Chip-on-a-Board, etc. Many of these packaging techniques involve grasping the substrate with a vacuum pickup from one location, manipulating the substrate in some way, and then placing it back down onto another or the same location. For example, when using flip chip packaging, the substrate must be lifted from a tray containing the substrates, flipped, and then solder balls are mounted onto pads located on the substrates.

In order for the vacuum pickup to obtain a good temporary bond with the substrate, the substrate should be horizontal with respect to the vacuum pickup. In some cases, when the substrates are lying on a substrate tray, the substrates are not lying perfectly horizontal because they may not be fully seated within depressions built into the tray designed to hold the substrates. When the substrate is not fully horizontal with respect to the vacuum pickup the chances of the vacuum pickup being able pick up the substrate goes down. Should a substrate not be picked up, intervention is often required to fix the positioning of the substrate to permit the vacuum pickup to attach to the substrate.

Intervention is not desired in an efficient packaging process since it often requires stopping the packaging process and a human operator making the required adjustments. Intervention slows down the process and increases overall production costs.

Solutions using custom designed substrate trays can reduce the number of substrates that are not lying horizontally, but they typically require a special tray for each size and type of substrate. This increases the costs and overhead associated with the packaging process, especially in packaging plants that process a wide variety of different substrates.

Therefore, a need has arisen for a method and apparatus that can increase the probability of a vacuum pickup forming a solid bond with a substrate by ensuring that the substrates are lying horizontal with respect to the vacuum pickup.

SUMMARY OF THE INVENTION

In one aspect, the present invention provides a method of ensuring proper contact between a plurality of substrates and a lifting device with a plurality of nozzles in a semiconductor packaging process wherein the substrates are placed one each in depressions in a substrate tray and in each depression there is a hole, the method comprising: raising a plate with a plurality of protrusions through the tray, with each protrusion going through a hole, lowering the lifting device onto the tray, stopping when nozzles from the lifting device comes into contact with the substrates, and applying a vacuum at the nozzles to temporarily attach the substrates to the nozzles.

In another aspect, the present invention provides an apparatus for lifting substrates in a semiconductor packaging process, the apparatus comprising: a plate with a plurality of protrusions, a substrate tray with a plurality of depressions and a hole in each depression coupled to the plate, the substrate tray capable of holding a substrate in each depression, a lifting device with a plurality of nozzles coupled to the substrate tray, the lifting device capable of attaching to the substrates and lifting them out of the substrate tray, a first actuator coupled to the plate, the first actuator to raise and lower the plate; and a second actuator coupled to the lifting device, the second actuator to lower and raise the lifting device.

The present invention provides a number of advantages. For example, use of a preferred embodiment of the present invention reduces the probability of requiring intervention in a packaging process by reducing the chance of a substrate not being picked up by a vacuum pickup down to almost zero. The net result is an increase in productivity.

Also, use of a preferred embodiment of the present invention incurs no additional cost during normal packing operations. The only costs incurred involve the creation of a plate used to lift the substrates.

BRIEF DESCRIPTION OF THE DRAWINGS

The above features of the present invention will be more clearly understood from consideration of the following descriptions in connection with accompanying drawings in which:

FIG. 4 provides a plan view of an apparatus for ensuring that substrates are flat when presented to the pickup according to a preferred embodiment of the present invention;

DETAILED DESCRIPTION OF ILLUSTRATIVE EMBODIMENTS

The making and use of the various embodiments are discussed below in detail. However, it should be appreciated that the present invention provides many applicable inventive concepts, which can be embodied in a wide variety of specific contexts. The specific embodiments discussed are merely illustrative of specific ways to make and use the invention, and do not limit the scope of the invention.

Figure 1A:
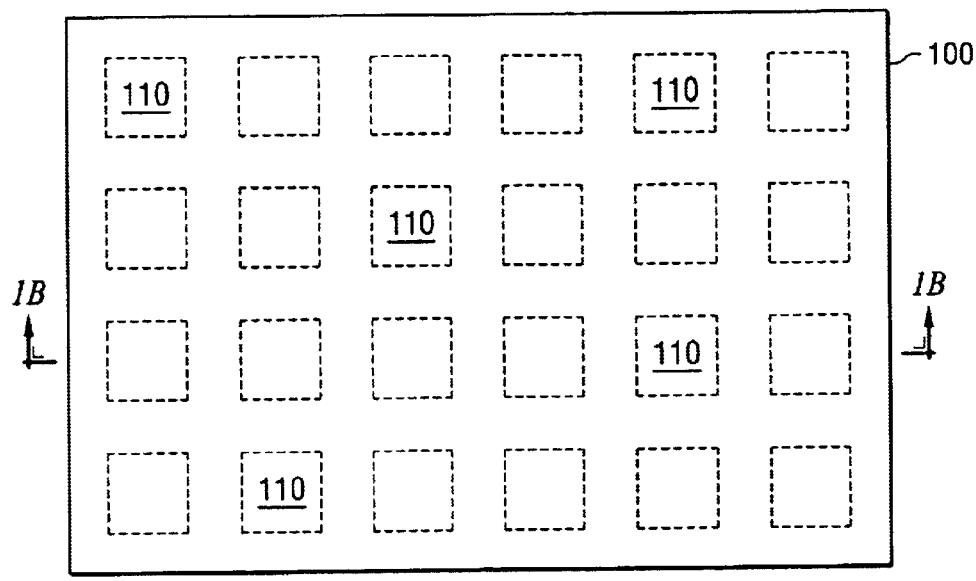
FIGS. 1a and 1b provide a top-down and side view of a substrate tray designed to hold substrates.

Referring now to FIG. 1a, a diagram provides a top-down view of a substrate tray 100. The substrate tray 100, in some packaging applications, referred to as a Jedec tray, is used to hold a number of singulated units 110 (substrates that have been cut from a silicon wafer). Alternatively, the singulated units 110 may be complete integrated circuit units wherein the unit comprising a plurality of dies that were cut from silicon wafers and the unit is ready for functional and error testing once electrical connectivity is made. The tray 100 holds the singulated units 110 in a neat and orderly fashion to facilitate easy and accurate handling. To facilitate precise placement of the singulated units 110, the tray 100 may feature properly sized indentations, ridges, or bumps (not shown) for use in aligning the singulated units 110.

Figure 1B:
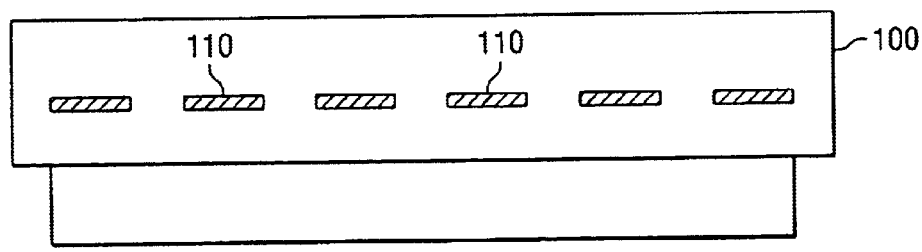

Referring now to FIG. 1b, a diagram provides a view along one lateral axis of the substrate tray 100 displayed in FIG. 1a. For illustrative purposes, the tray 100 is shown as if it is clear, permitting a view of the singulated units 110 lying within the tray. FIG. 1b illustrates an idealized situation where the singulated units 110 lying in the tray 100 are lying flat, perhaps within the indentations, ridges, or bumps (not shown) present on the tray 100, as well as being equally spaced with respect to one another.

For packaging operations where precision is a necessity, the position of the singulated units 110 within the tray 100 is crucial. Due to the indentations, ridges, or bumps used for aligning the singulated units 110 within the tray 100, occasionally, some singulated units 110 are placed in the tray in such a way that they are not seated properly within the indentations, ridges, or bumps. When this occurs, the singulated units 110 can lie at an angle with respect to the tray 100.

Since the packaging process is typically entirely machine driven, both for increased speed and accuracy purposes, a misaligned singulated unit may result in a packaged product that does not work properly or worse, it may cause the packaging process to be halted to allow human intervention to fix the alignment problem. Therefore, it is desirable to minimize the occurrence of misaligned singulated units.

After the singulated units are in place in the trays, a lifting unit is used to pick up the singulated units from the tray and move them to a position for a packaging operation to take place. The lifting unit is sometimes referred to as a back-up unit and uses vacuum to lift up the singulated units from the tray. In a flip chip packaging process, an example of the use of the back-up unit is when the singulated units are lifted from the trays by the back-up unit, flipped so that a side that was formerly resting on the bottom of the tray is now facing upwards, and solder bumps are applied to pads on the substrate.

Figure 2A:
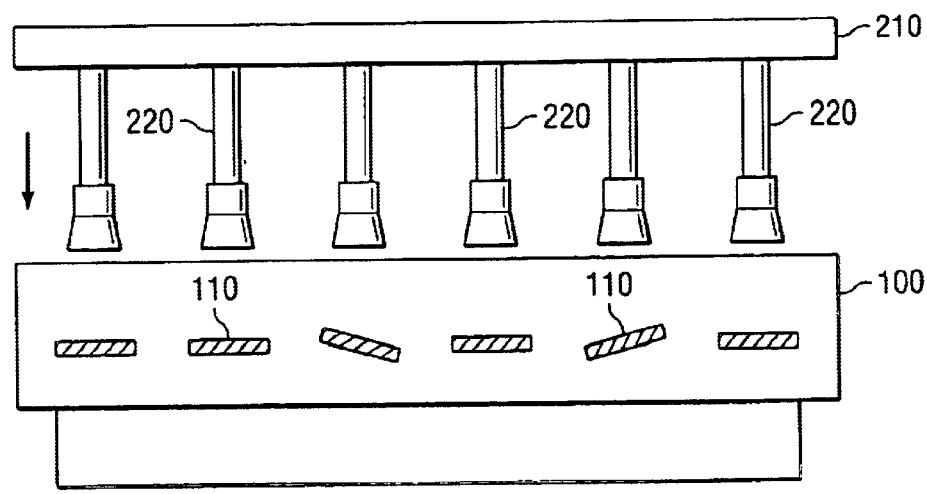
FIGS. 2a–c provide views of a vacuum pickup attempting to pick up substrates where some of the substrates are not lying flat in the substrate tray.
Figure 2B:
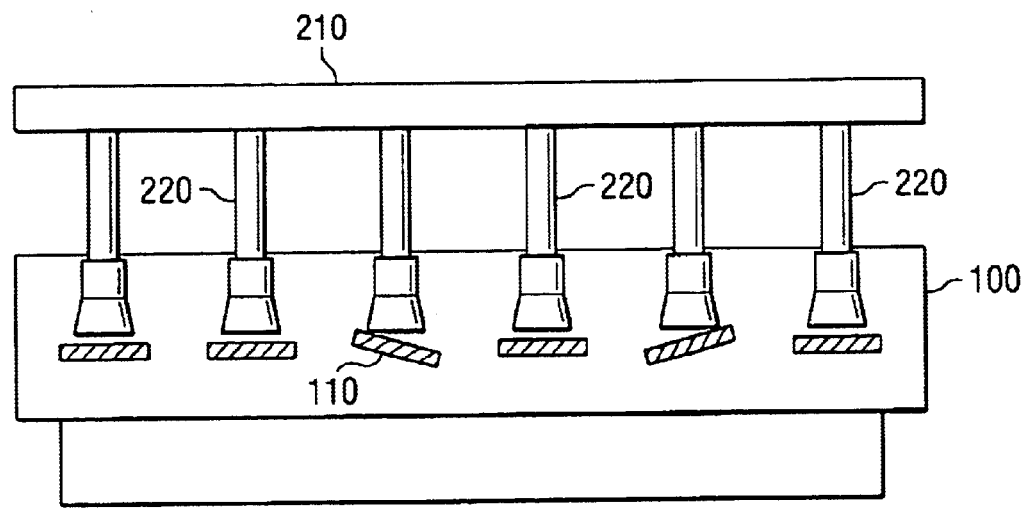
Figure 2C:
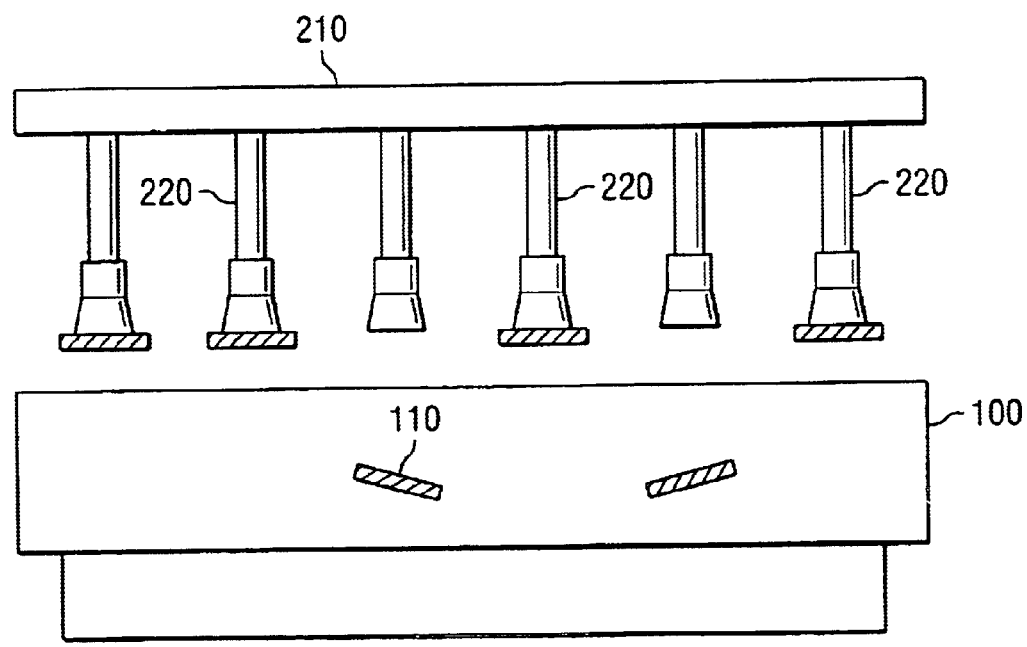

Referring now to FIGS. 2a–c, diagrams illustrate the lifting of singulated units 110 from a tray 100 using a lifter unit 210. FIG. 2a illustrates the lifter unit 210 moving in a downward motion towards the tray 100 and the singulated units 110 therein. FIG. 2b illustrates the lifter unit 210 nearing a bottom limit of its travel, resting almost immediately upon the singulated units 110. When the lifter unit 210 is at the bottom of its travel, a vacuum is applied and the singulated units 110 are attached to individual vacuum pads 220 of the lifter unit 210.

With the vacuum applied and the singulated units 110 attached to the individual vacuum pads 220 of the lifter unit 210, the lifter unit 210 begins to travel in an upward motion to lift the singulated units 110 out of the tray 100. In some packaging operations, the lifter unit 210 also incorporates other functionality, such as flipping the singulated units 110 as well. Unfortunately, some of the singulated units 110, the ones that were not laying flat on the tray 100, were not lifted by the lifter unit 210. This may have been due to an improper vacuum pressure being made with the individual vacuum pads 220 that are a direct result of the singulated units 110 not lying flat on the tray 100.

A result of some of the singulated units not being picked up by the lifter unit 210 may be the singulated units being rerun through the packaging process, the packing process may be stopped to permit human intervention in fixing the positioning of the singulated units, or the singulated units may be packaged incorrectly and the discarding of the singulated unit and any packaging materials already used on the singulated units.

An apparatus that can reduce or eliminate the problem of the singulated units not laying flat in the trays can increase the efficiency of the packaging process and possibly reduce the number of faultily packaged units. Such an apparatus can increase profits for the manufacturer and reduce waste.

Referring now to FIGS. 3a–d, diagrams illustrate an apparatus for eliminating the problem of singulated units not resting flat on the tray according to a preferred embodiment of the present invention. Rather than attempting to pick up the singulated units 110 from the tray 300 with the lifter unit 210 while the singulated units 110 are lying directly upon the tray 300, in a preferred embodiment of the present invention, a back-up plate 310 with a plurality of protrusions 320 protruding from one surface of the back-up plate 310 moves in an upward direction from beneath the tray 300. The back-up plate 310 is driven by a pneumatic actuator (not shown) that moves the plate in an up and down motion. According to another preferred embodiment of the present invention, the back-up plate 310 may be driven by a hydraulic actuator rather than a pneumatic actuator. Accordingly, the tray 300 necessarily has a series of holes in its bottom to mate with the protrusions 320 from the back-up plate 310. The holes should be sufficiently small so that the singulated units 110 do not fall through. The back-up plate 310 is preferably fabricated from a metallic material, such as aluminum or steel, to provide thermal stability and good strength. However, other materials which are capable of withstanding a high temperature processes and possible exposure to caustic chemicals, such as carbon fiber, are usable.

Figure 3A:
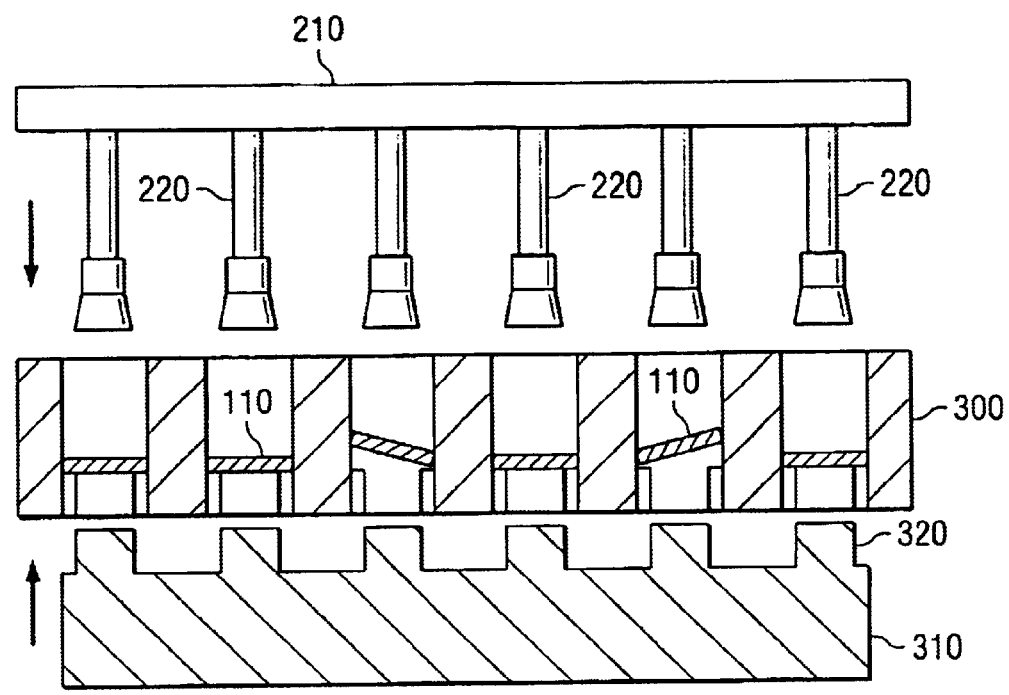
FIGS. 3a–d provide views of a vacuum pickup picking up substrates with use of an apparatus for ensuring that the substrates are flat when presented to the pickup according to a preferred embodiment of the present invention.
Figure 3B:
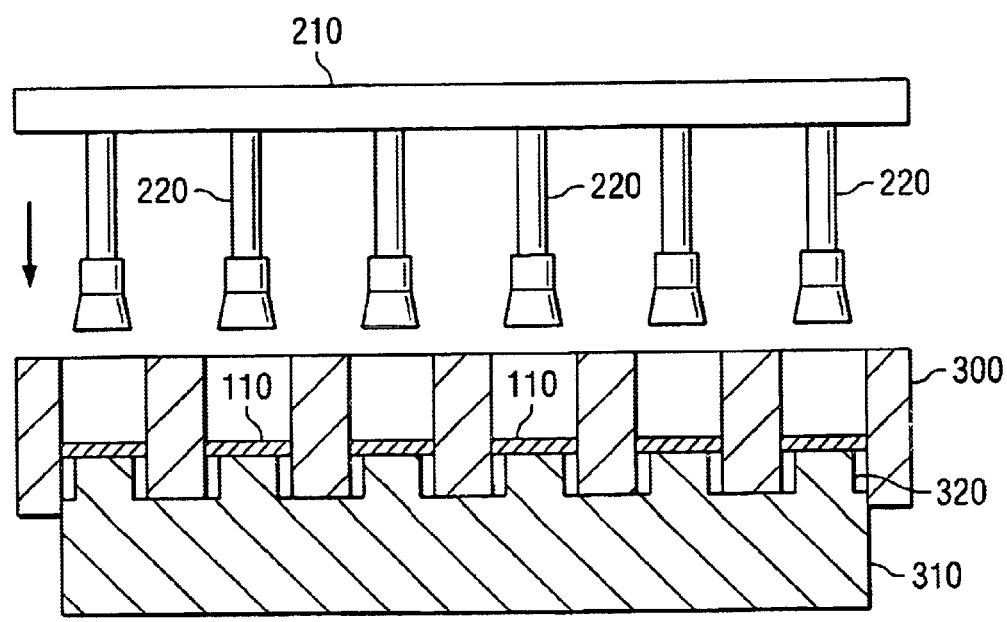

The protrusions 320 fit through openings at the bottom of the tray 300 and make contact with the singulated units 110 (FIG. 3b). As the tray 310 continues to move up, the protrusions 320 lift the singulated units 110 up off the bottom of the tray 300. According to a preferred embodiment of the present invention, the protrusions 320 are of sufficient height to raise the singulated units 110 above the bottom of the tray 300 plus a sufficient amount to provide clearance for any indentations, bumps, or ridges that may be present on the tray 300. Additionally, the tops of the protrusions 320 (the part that makes contact with the singulated units 110) should be flat to provide a stable resting surface for the singulated units 110.

Figure 3C:
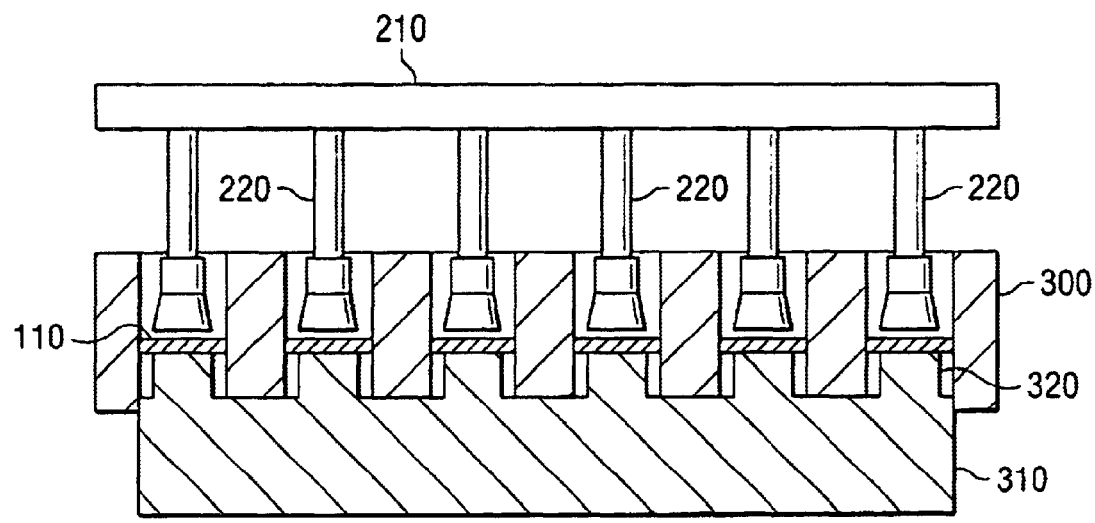
Figure 3D:
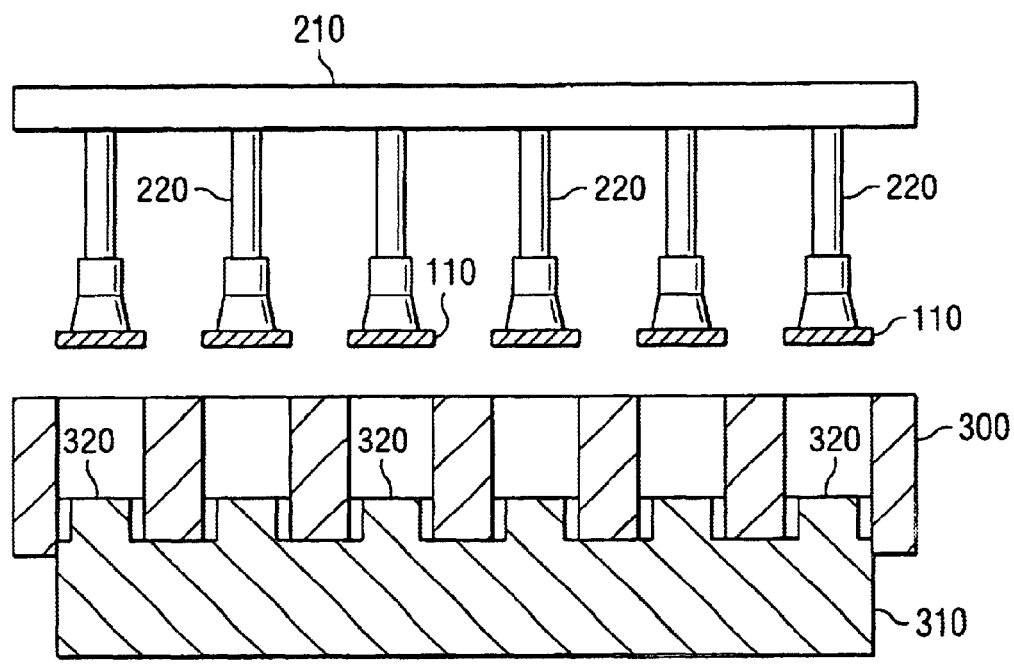

By raising the singulated units 110 up off the bottom of the tray 300, the back-up plate 310 ensures that the singulated units 110 in the tray are laying flat. This creates a good contact point for individual vacuum pads 220 of the lifter unit 210 when they are moved down by another actuator (not shown) to pick up the singulated units 110 (FIG. 3c). With each singulated unit making good contact with the vacuum pads 220 of the lifter unit 210, all are lifted out of the tray when the lifter unit 210 moves back out of the tray 300 (FIG. 3d).

According to a preferred embodiment of the present invention, the actuators used to raise the plate and to lower the lifting device are driven by compressed air (pneumatic). Alternatively, the actuators may be hydraulic in nature or they may be electrical motors with fine control.

Referring now to FIG. 4, a diagram provides a plan view of the tray 100 and the back-up plate 310 with the protrusions according to a preferred embodiment of the present invention. The plan view illustrates the tray 100 with depressions 310 with the holes in the depression bottom to match the protrusions 320 from the back-up plate 310. Once again, any depressions, ridges, or bumps present at the bottom of the tray 300 are not displayed.

FIG. 4 displays the protrusions 320 being square or rectangular in cross section. According to another preferred embodiment of the present invention, the cross section of the protrusions can be of other geometric shapes such as circles, ovals, triangle, for example. It is preferred that the cross section be of a shape that is easy to manufacture and provides some built-in measure of ruggedness. For example, while a protrusion with a multi-faceted cross section would surely function, the multiple facets would be difficult to manufacture and the facets themselves would likely be easily damaged during use.

Figure 5:
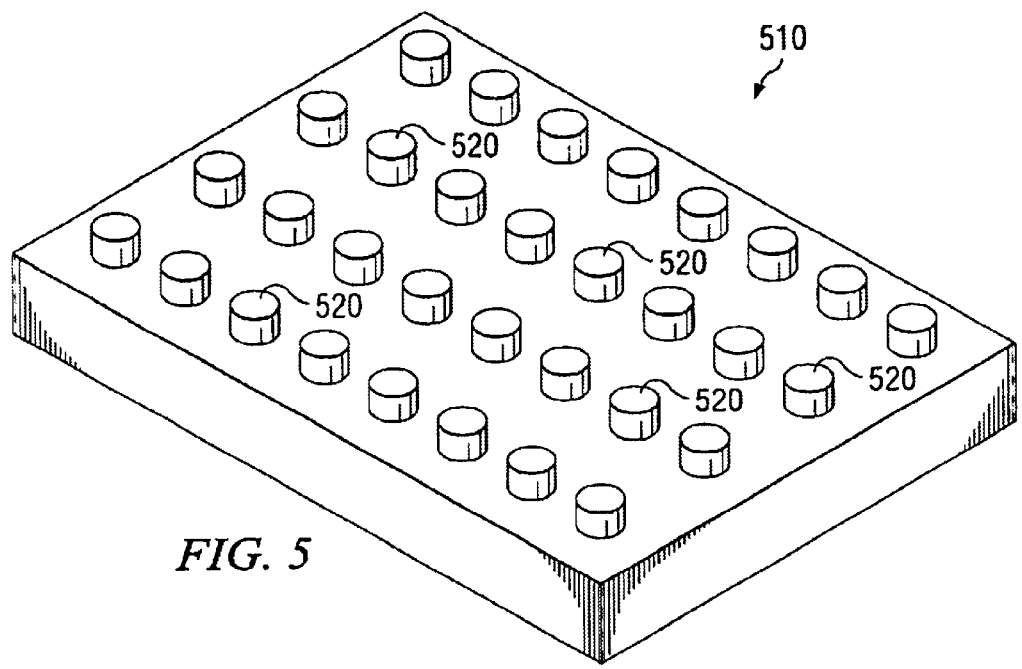
FIG. 5 provides an apparatus for ensuring that substrates are flat when presented to the pickup according to a preferred embodiment of the present invention.

Referring now to FIG. 5, a diagram provides a plan view of a tray 510 with protrusions 520 with a circular cross section according to a preferred embodiment of the present invention. As discussed previously, the circular cross section of the protrusions is relatively easy to manufacture and at the same time, provides a measure of ruggedness for increased durability during use.

To maximize flexibility in the design of the plates used for lifting the substrates, it can be preferred that the back-up plates be designed in a modular fashion so that several of them may be joined together to form a larger plate to meet changing needs and requirements.

Figure 6A:
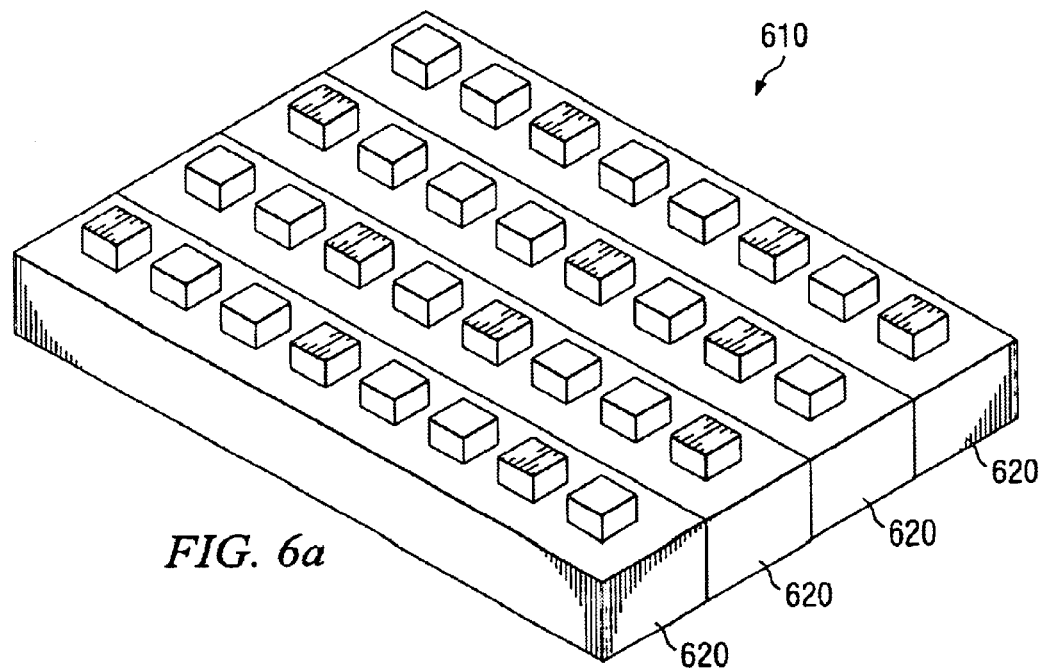
FIGS. 6a and 6b provide other apparatus for ensuring that substrates are flat when presented to the pickup according to a preferred embodiment of the present invention.
Figure 6B:
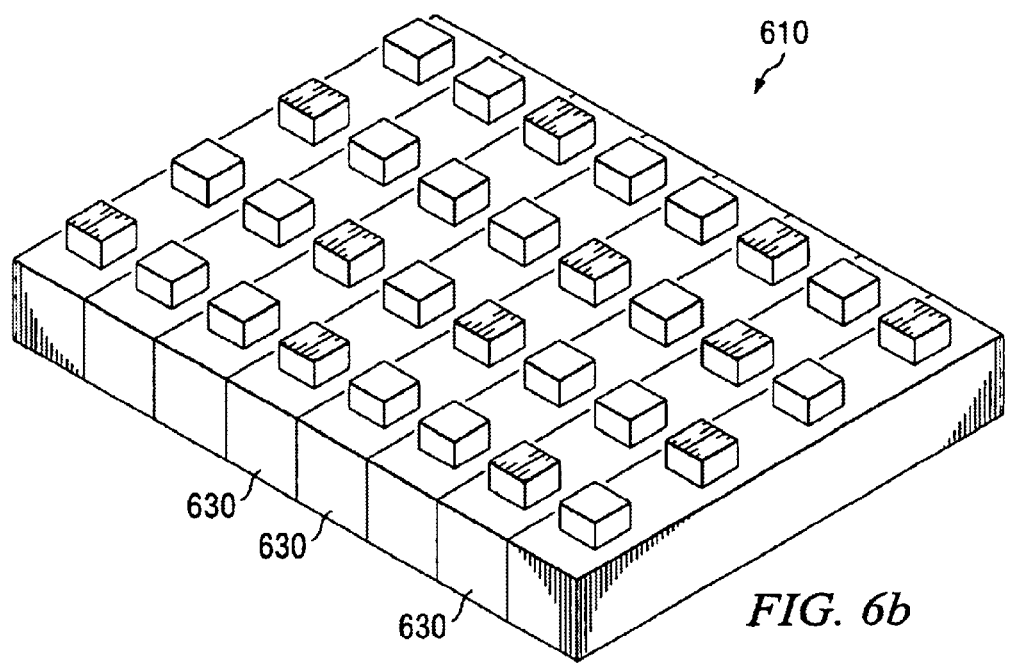

Referring now to FIGS. 6a and 6b, diagrams illustrate the use of a basic plate building block to create custom plate sizes according to a preferred embodiment of the present invention. A basic plate can be created, for example, in FIG. 6a the basic block is a linear plate 620 with eight protrusions, which can then be connected together to create a larger plate 610. The use of a basic plate allows the flexibility to support substrate trays of almost any arbitrary size An example of the use of a preferred embodiment of the present invention is in a flip chip packaging process. One step in the packaging of substrates using flip chip packages is the application of solder bumps to ball lands dispersed through out a substrate. In order to apply the solder bumps to the substrates, it is necessary that the substrates be flipped. Using the previously described, prior art method for flipping substrates, a significant percentage of the substrates are not flipped due to the substrates not lying flat in the Jedec trays and subsequently not being picked up by the lifting device. Use of the present invention would reduce the number of unflipped substrates and machine errors.

Figure 7:
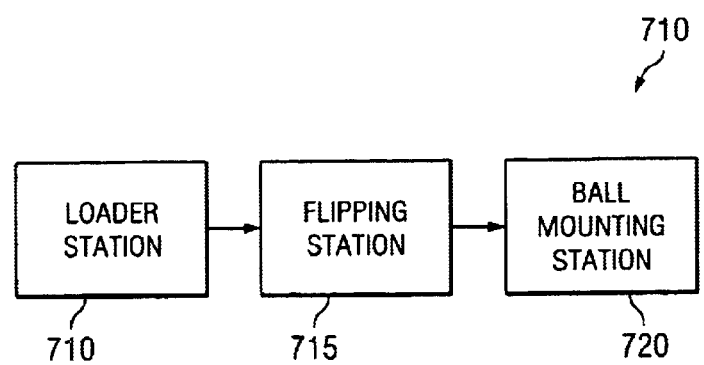
FIG. 7 provides a view of a portion of a flip chip packaging process using an apparatus for ensuring that substrates are flat when presented to the pickup according to a preferred embodiment of the present invention.

Referring now to FIG. 7, a diagram illustrates a portion of the flip chip packaging process 700 utilizing the lifting plates according to a preferred embodiment of the present invention. The substrates are loaded into a substrate tray at a loading station 710 and are moved along the packaging process 700. When the substrate tray arrives at a flipping station 715, a plate with appropriately sized protrusions is lifted into the bottom of the substrate tray, lifting the substrates from the bottom of the tray. As discussed previously, in certain applications, a substrate lifting operation can be combined with another mechanical operation. In the case of flip chip packaging, the substrate lifting operation is commonly combined with a flipping operation. A flipping arm with vacuum pads moves in a downward direction towards the lifted substrates and a vacuum pressure is applied at the vacuum pads to create a temporary bond between the substrates and the vacuum pads. The flipping arm lifts and flips the singulated units in a single rotary motion.

Once flipped, the substrates are moved to a solder ball application station 720 where the solder bumps are attached to the substrates. The substrates with attached solder bumps continue down the flip chip packaging process 700 where they receive additional process steps.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of ensuring proper contact between a plurality of substrates and a lifting device with a plurality of vacuum pads in a semiconductor packaging process wherein the substrates are placed, one each, in depressions in a substrate tray, each depression having a hole, the method comprising the steps of:

providing a substrate tray having depressions therein with a substrate in each said depression, each depression having a hole;

providing and raising a plate with a plurality of protrusions each protrusion extending through a different said hole and maintaining level or leveling the substrate in the corresponding depression while lifting said substrate concurrently with the other of the plurality of substrates in the other of said depressions;

providing and then lowering the lifting device having vacuum pads onto the tray;

stopping the lifting device when the vacuum pads from the lifting device comes into contact with the substrates; and applying a vacuum at the vacuum pads to temporarily attach the substrates to the vacuum pads.

2. The method of claim 1, wherein the protrusions on the plate are of sufficient height to lift the substrates up off the bottom of the tray.

3. The method of claim 1, wherein the protrusions on the plate are of sufficient height to lift the substrates up off the bottom of the tray and over the depressions in which they lie.

4. The method of claim 1, wherein the holes in the tray are sufficiently sized to permit the protrusions to come through the bottom of the tray.

5. The method of claim 4, wherein the holes in the tray are sufficiently small to prevent the substrates from falling through.

6. The method of claim 1, wherein the method further comprises the step of raising the lifting device out of the tray after applying the vacuum.

7. The method of claim 1, wherein the protrusions are arranged in a two-dimensional array on the plate.

8. The method of claim 1, wherein the protrusions are arranged in a linear array on a strip and a plurality of strips are joined to form the plate.

* * * * *